(12) United States Patent
Weaver et al.

(10) Patent No.: US 8,292,402 B2
(45) Date of Patent: Oct. 23, 2012

(54) PHOTOIMAGEABLE DRY FILM FORMULATION

(75) Inventors: Sean Terrance Weaver, Union, KY (US); Rich Wells, Delaware, OH (US)

(73) Assignee: Lexmark International, Inc., Lexington, KY (US)

( * ) Notice: Subject to any disclaimer, the term of this patent is extended or adjusted under 35 U.S.C. 154(b) by 1228 days.

(21) Appl. No.: 12/030,467

(22) Filed: Feb. 13, 2008

(65) Prior Publication Data

US 2009/0201338 A1    Aug. 13, 2009

(51) Int. Cl.
*B41J 2/14*   (2006.01)
(52) U.S. Cl. ........................... 347/47; 430/270.1
(58) Field of Classification Search ............... 347/47; 430/270.1
See application file for complete search history.

(56) References Cited

U.S. PATENT DOCUMENTS

| | | | | |
|---|---|---|---|---|
| 5,069,998 | A | * | 12/1991 | Schwalm et al. .......... 430/270.1 |
| 6,283,584 | B1 | * | 9/2001 | Powers et al. .................... 347/65 |
| 6,512,075 | B1 | * | 1/2003 | Tzou ................................ 528/98 |
| 6,841,333 | B2 | * | 1/2005 | Lamanna et al. .......... 430/270.1 |
| 7,067,227 | B2 | | 6/2006 | Montgomery et al. |
| 2004/0087690 | A1 | * | 5/2004 | Lamanna et al. ............. 524/155 |
| 2006/0001698 | A1 | * | 1/2006 | Hart et al. ....................... 347/40 |
| 2006/0221115 | A1 | * | 10/2006 | Patil ................................ 347/20 |
| 2007/0076060 | A1 | | 4/2007 | Weaver et al. |
| 2007/0208106 | A1 | * | 9/2007 | Chen et al. .................... 523/137 |

* cited by examiner

*Primary Examiner* — Charlie Peng
*Assistant Examiner* — Peter Radkowski

(57) ABSTRACT

The present disclosure relates to photoresist compositions suitable for thin layer photoimageable nozzle plates for micro-fluid ejection devices and methods of making and using such thin layer nozzle plates. The photoresist compositions may comprise a high-molecular weight phenoxy resin, a di-functional epoxy resin, and a multi-functional epoxy resin.

6 Claims, 3 Drawing Sheets

PHOTOIMAGEABLE DRY FILM FORMULATION

TECHNICAL FIELD

The disclosure relates to improved photoimageable dry film formulations for use in making nozzle members, such as for micro-fluid ejection heads, and to micro-fluid ejection heads having nozzle members made using such photoimageable dry film formulations.

BACKGROUND AND SUMMARY

Micro-fluid ejection devices, such as ink jet printers, continue to evolve as the technology for ink jet printing continues to improve to provide higher speed, higher quality printers. However, the improvement in speed and quality does not come without a price. The micro-fluid ejection heads are more costly to manufacture because of tighter alignment tolerances.

For example, some conventional micro-fluid ejection heads were made with nozzle plates (a form of a nozzle member) containing flow features. The nozzle plates were then aligned, and adhesively attached to a semiconductor substrate. However, minor imperfections in the substrate or nozzle plate components of the ejection head or improper alignment of the parts has a significant impact on the performance of the ejection heads.

One advance in providing improved micro-fluid ejection heads is the use of a photoresist layer applied to a device surface of the semiconductor substrate as a thick film layer. The thick film layer is imaged to provide flow features for the micro-fluid ejection heads. Use of the imaged thick film layer enables more accurate alignment between the flow features and ejection actuators on the device surface of the substrate.

While the use of an imaged photoresist layer improves alignment of the flow features to the ejection actuators, there still exist alignment problems and difficulties associated with a nozzle plate attached to the thick film layer. Misalignment between the ejection actuators and corresponding nozzles (e.g., holes) in a nozzle plate has a disadvantageous effect on the accuracy of fluid droplets ejected from the nozzles when the nozzles are formed in the nozzle plate before attaching the nozzle plate to the thick film layer. Ejector actuator and nozzle alignment also has an effect on the mass and velocity of the fluid droplets ejected through the nozzles.

Conventional nozzle plates have been made from metal or a polyimide material that was laser ablated then adhesively attached to the thick film layer. Use of such nozzle plates require an alignment step to assure that the nozzles correspond with the fluid ejector actuators and flow features in the thick film layer. In order to eliminate such alignment steps, photoimageable nozzle plate materials may be directly applied to the thick film layer on the substrate by spin coating or lamination techniques. Spin coating techniques may be used to apply the nozzle plate photoresist material to the thick film layer before the flow features are developed in the thick film layer. However, developing the flow features in the thick film layer after applying the nozzle plate materials to the thick film layer requires difficult processing techniques.

In the alternative, lamination techniques may be used to apply the nozzle plate materials to an imaged and developed thick film layer. However, typical dry films that are available are generally used for various printed circuit board applications which require fairly thick photoresist layers ranging from about 35 microns to about 50 microns in thickness. These typical thickness ranges may be too great to be used in a photoimageable nozzle plate process.

Traditional photoresist formulations are often unable to be screened down into a thin film and dried without becoming extremely brittle. Brittleness makes such formulations difficult to process onto a wafer. It is believed that the brittleness may be due to the room temperature properties of the resin components of the resist, since commonly used epoxy resins may be brittle crystalline solids at room temperature. Hence, a need exists for a specific photoresist formulation containing epoxy resins that may be capable of forming a thin film ranging from 1 to 30 microns in thickness.

Accordingly, there is a need for improved photoresist or photoimageable materials that may be used as nozzle materials that may be laminated as a thin film layer adjacent to a thick film layer of a micro-fluid ejection head structure.

Among other embodiments of the provided in the disclosure, there is provided an improved photoimageable nozzle member for a micro-fluid ejection head, a micro-fluid ejection head containing the improved nozzle member, and a method for making a micro-fluid ejection head.

In one embodiment, a photoimageable nozzle member for a micro-fluid ejection head is disclosed. The nozzle member may include a photoresist material derived from a composition comprising a high molecular weight phenoxy resin, a di-functional epoxy resin, a multi-functional epoxy resin, an optional adhesion enhancer, a photoacid generator devoid of aryl sulfonium salts, and an aliphatic ketone solvent. The nozzle member may have a thickness ranging from about 1 to about 50 microns.

In another embodiment, there is provided a method for making an improved micro-fluid ejection head. The method includes applying a photoresist thick film layer adjacent to a device surface of a substrate. A plurality of flow features are imaged in the thick film layer. The imaged first photoresist layer is developed to provide the plurality of flow features therein and to provide a substantially planar thick film layer surface. A thin film photoresist layer is applied adjacent to the thick film layer. The thin film photoresist layer has a thickness ranging from about 1 to about 50 microns and is derived from a thin film photoresist epoxy resin composition including a high-molecular weight phenoxy resin, a di-functional epoxy resin, and a multi-functional epoxy resin. A plurality of nozzles is imaged in the thin film photoresist layer. The imaged thin film photoresist layer is developed to provide a photoresist nozzle member adjacent to the thick film layer.

An advantage of at least some of the exemplary embodiments described herein is that lamination of a dry film photoresist layer adjacent to a substrate and thick film layer for a micro-fluid ejection head enables wafer level processing of the ejection head. Wafer level processing means that separate processing steps for the nozzle member and the semiconductor substrate may be eliminated in favor of photoimaging and developing the composite substrate containing materials providing the flow features and nozzles. Accordingly, laser ablation steps for the nozzle member as well as alignment tolerances, and adhesives, used to attach the nozzle member to the substrate may be avoided. Other potential benefits of the disclosed embodiments include reduction in raw materials required, potential improvement in ejection head performance, improvement in adhesion and durability of the composite substrate and nozzle member structure, and significant manufacturing cost savings.

For purposes of the disclosure, "difunctional epoxy" means epoxy compounds and materials having only two epoxy functional groups in the molecule. "Multifunctional epoxy" means epoxy compounds and materials having more than two epoxy functional groups in the molecule.

BRIEF DESCRIPTION OF THE DRAWINGS

Further advantages of the exemplary embodiments will become apparent by reference to the detailed description when considered in conjunction with the figures, which are not to scale, wherein like reference numbers indicate like elements through the several views, and wherein.

DETAILED DESCRIPTION OF THE EXEMPLARY EMBODIMENTS

Figure 1:
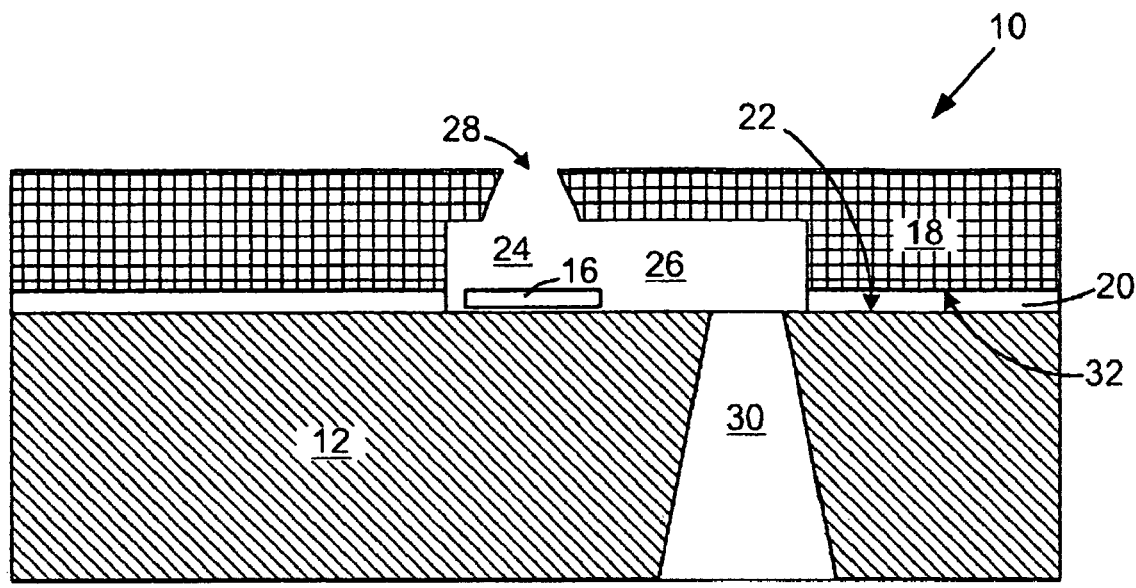
FIG. 1 is a cross-sectional view, not to scale, of a portion of a prior art micro-fluid ejection head.

With reference to FIG. 1, there is shown, in partial cross-sectional view, a portion of a prior art micro-fluid ejection head 10. The micro-fluid ejection head 10 includes a substrate 12 containing various insulative, conductive, resistive, and passivating layers providing a fluid ejector actuator 16.

In a prior art micro-fluid ejection head 10, a nozzle plate 18 is attached as by an adhesive 20 to a device surface 22 of the substrate 12. In such micro-fluid ejection head 10, the nozzle plate 18 is made out of a laser ablated materials such as polyimide. The polyimide material is laser ablated to provide a fluid chamber 24 in fluid flow communication with a fluid supply channel 26. Upon activation of the ejector actuator, fluid is expelled through a nozzle 28 that is also laser ablated in the polyimide material of the nozzle plate 18. The fluid chamber 24 and fluid supply channel 26 are collectively referred to as "flow features." A fluid feed slot 30 is etched in the substrate 12 to provide fluid via the fluid supply channel 26 to the fluid chamber 24.

In order to provide the laser ablated nozzle plate 18, the polyimide material is laser ablated from a flow feature side 32 thereof before the nozzle plate 18 is attached to the semiconductor substrate 12. The nozzle plate 18 is then aligned and adhesively attached to the substrate 12. If the flow feature tolerances ablated in the nozzle plate 18 are slightly off, or if the nozzle plate 18 is not attached to the substrate 12 within acceptable tolerances, misalignment between the flow features in the nozzle plate 18 and the fluid ejector actuator 16 may be detrimental to the functioning of the micro-fluid ejection head 10.

Figure 2:
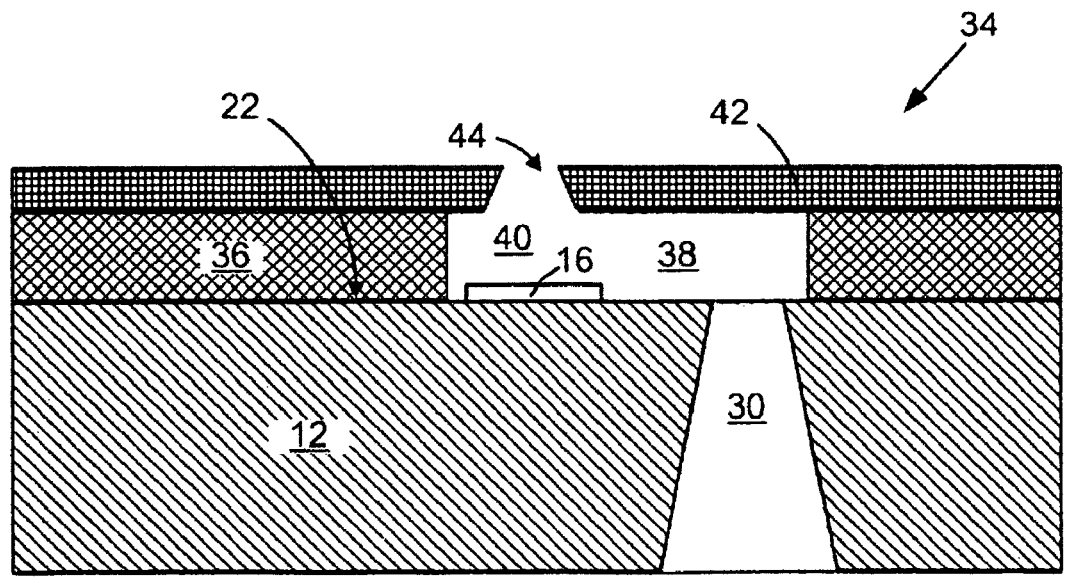
FIG. 2 is a cross-sectional view, not to scale, of a portion of another prior art micro-fluid ejection head containing a thick film layer.

Another prior art micro-fluid ejection head 34 is illustrated in FIG. 2. In this prior art micro-fluid ejection head 34, a thick film layer 36 provides the flow features, i.e., a fluid supply channel 38 and a fluid chamber 40 for providing fluid to the fluid ejector actuator 16. In such an ejection head 34, the thick film layer 36 is a photoresist material that is spin coated onto the device surface 22 of the substrate 12. The photoresist material is then imaged and developed using conventional photoimaging techniques to provide the flow features.

One embodiment of a suitable composition of the thick film layer 36 and its application to the substrate 12 and subsequent development into flow features is described in U.S. Patent Application Publication No. 2007/0076060, incorporated by reference herein.

A separate nozzle member, such as plate 42 containing only nozzles, such as nozzle 44, is then attached to the thick film layer 36 as by thermal compression bonding or by use of an adhesive. As in FIG. 1, the nozzle plate 42 may be made of a laser ablated polyimide material that is laser ablated before attaching the nozzle plate 42 to the thick film layer 36. Accordingly, the ablation tolerances for the nozzles 44 in the nozzle plate 42, or the alignment tolerances between the nozzle plate 42 and the thick film layer 36 are critical to the proper functional of the ejection head 34. As the flow features become smaller, alignment between the various components of the ejection heads 10 and 34 becomes even more critical to the proper functioning of the ejection heads 10 and 34.

Figure 3:
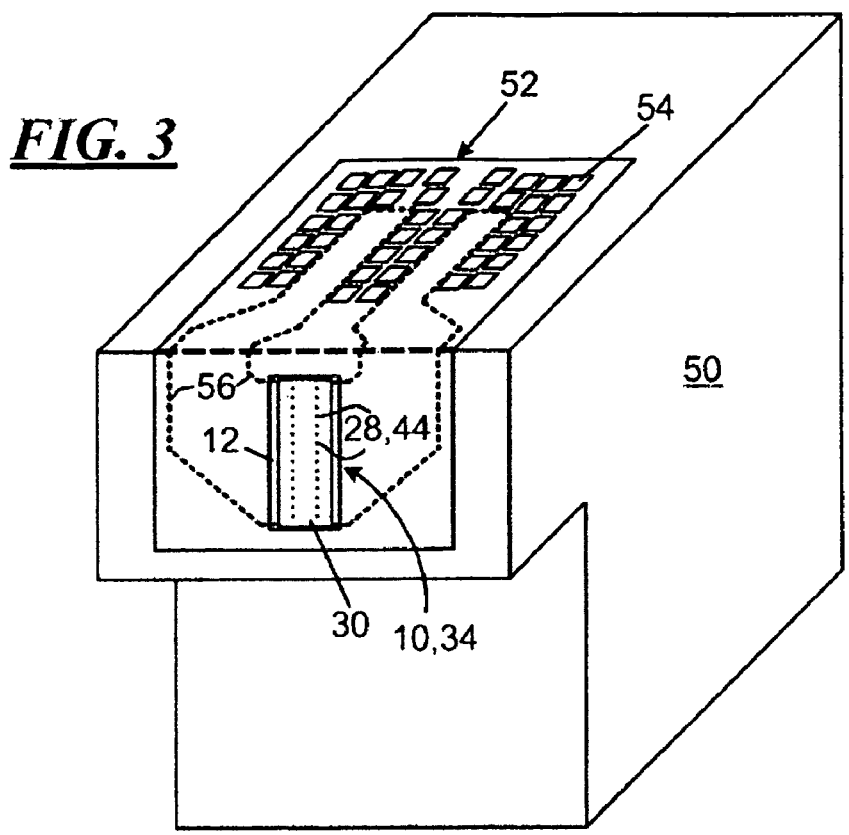
FIG. 3 is a perspective view, not to scale, of a fluid cartridge containing a micro-fluid ejection head.
Figure 4:
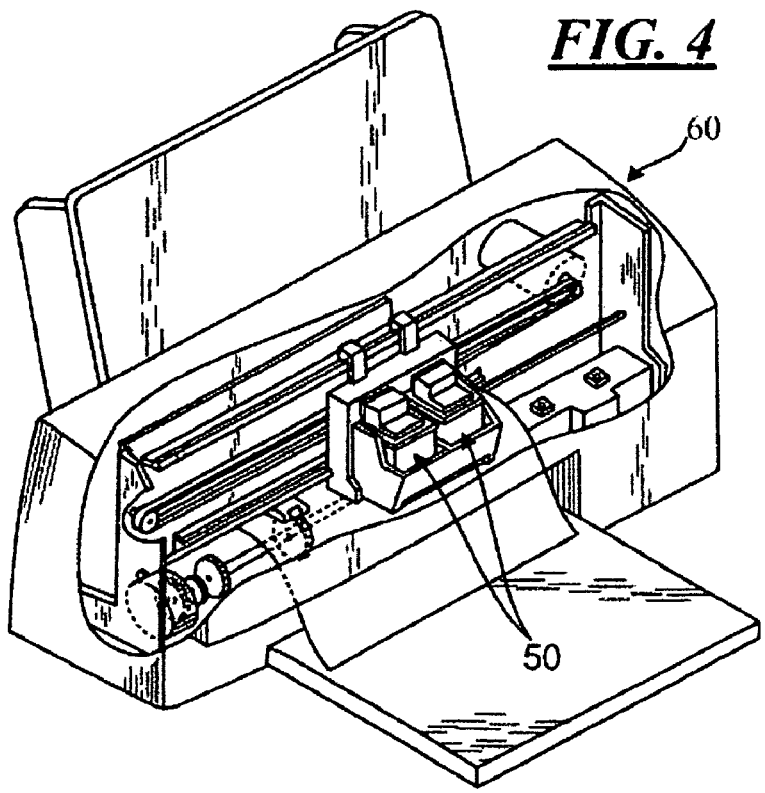
FIG. 4 is a perspective view, not to scale, of a micro-fluid ejection device.

The micro-fluid ejection head 10 or 34 may be attached to a fluid supply reservoir 50 as illustrated in FIG. 3. The fluid reservoir 50 includes a flexible circuit 52 containing electrical contacts 54 thereon for providing control and actuation of the fluid ejector actuators 16 on the substrate 12 via conductive traces 56. One or more reservoirs 50 containing the ejection heads 10 or 34 may be used in a micro-fluid ejection device 60, such as an ink jet printer as shown in FIG. 4 to provide control and ejection of fluid from the ejection heads 10 or 34.

Figure 5:
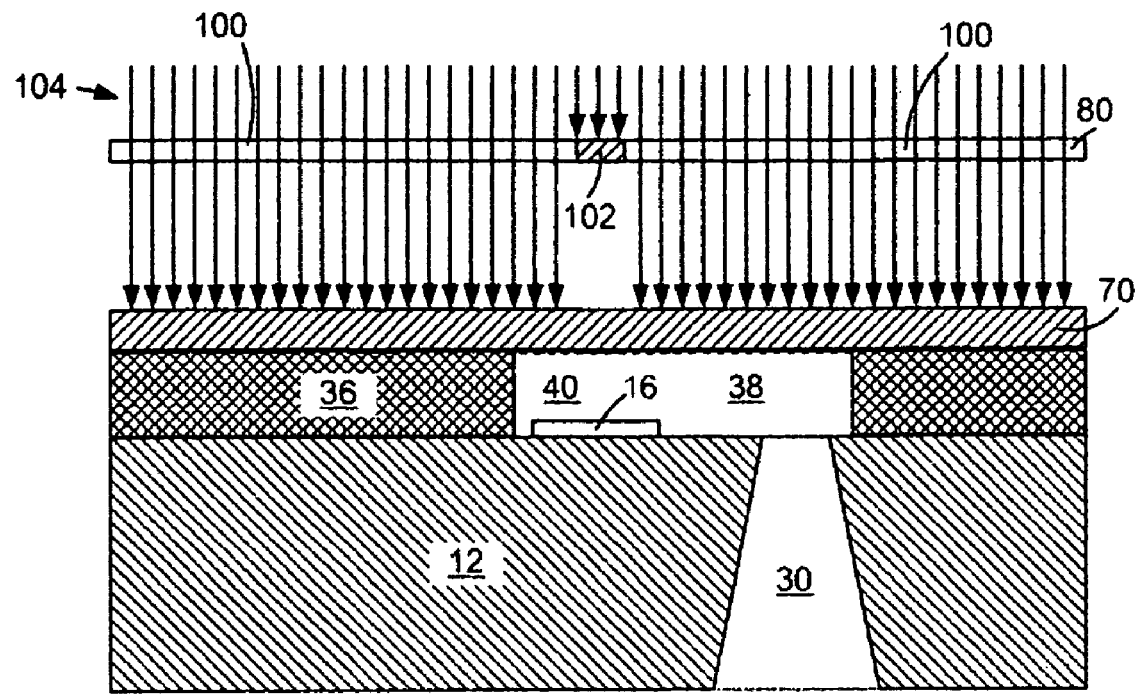
FIG. 5 is a schematic view of a process for imaging a thin film photoresist layer providing a nozzle plate on a thick film layer of a substrate.

In view of the criticality of alignment tolerances for micro-fluid ejection heads, new materials and methods have been developed that may greatly improve the manufacturing process and functionality of such micro-fluid ejection heads. With reference now to FIG. 5, subsequent to imaging and developing the thick film layer 36, a thin film photoresist layer 70 may be laminated adjacent to the thick film layer 36. The thin film photoresist layer 70 may be provided in part by a dry film photoresist material derived from a thin film photoresist epoxy resin composition comprising a high-molecular weight phenoxy resin, a di-functional epoxy resin, and a multi-functional epoxy resin.

The high-molecular weight phenoxy resin may have a number average molecular weight ranging from about 10,000 Daltons to about 20,000 Daltons, and in one embodiment may have a number average molecular weight of about 13,000 Daltons. The phenoxy resin is believed to serve as a flexibilizer for the thin film photoresist epoxy resin composition thereby reducing the brittleness of the layer 70.

Suitable phenoxy resins are sold under the trade names PKHP and PKHS-40, available from InChem Corporation of Rock Hill, S.C. An especially suitable resin is PKHS-40 resin, which is 40% by weight of PKHP resin in methyl ethyl ketone.

Such phenoxy resins may be particularly useful in making the thin film photoresist epoxy resin composition, in part because they may not crystallize or build up stress concentrations. Suitable phenoxy resins may have high temperature characteristics that enable stability over a wide temperature range including temperatures above about 38° C. The thin film photoresist epoxy resin composition may contain from about 10 to about 30 percent by weight of high-molecular weight phenoxy resin based on the total weight of the thin film photoresist epoxy resin composition. In one embodiment, the thin film photoresist epoxy resin composition may contain about 15 to about 25 percent by weight of high-molecular weight phenoxy resin based on the total weight of the thin film photoresist epoxy resin composition.

The di-functional epoxy compound used for providing the thin film photoresist epoxy resin composition may comprise a di-functional naphthalene epoxy resin. A suitable di-functional naphthalene epoxy resin may be a distilled naphthalene liquid epoxy resin, such as sold under the trade name EPICLON, and as a suitable example, EPICLON HP-4032D resin, available from Dainippon Ink & Chemicals.

The thin film photoresist epoxy resin composition may contain from about 5 to about 25 percent by weight of the di-functional epoxy resin based on the total weight of the resin composition. In one embodiment, the thin film photoresist epoxy resin composition may contain about 12 to about 18 percent by weight of the di-functional epoxy resin based on the total weight of the thin film photoresist epoxy resin composition.

The multi-functional epoxy compound used for providing the thin film photoresist epoxy resin composition may comprise a multi-functional novolac epoxy resin. A suitable novolac epoxy resin may be an o-cresole-formaldehyde novolac epoxy resin, such as is sold under the trade name EPICLON, available from Dainippon Ink & Chemicals. The EPICLON N-600 series of novolac epoxy resins may be suitable as the multi-functional epoxy compound, and specifically EPICLON N-695 resin may be particularly suitable for use in thin film photoresist epoxy resin formulations according to the present disclosure The thin film photoresist epoxy resin composition may contain from about 5 to about 25 percent by weight of the multi-functional epoxy resin based on the total weight of the resin composition. In one embodiment, the thin film photoresist epoxy resin composition may contain about 12 to about 18 percent by weight of the multi-functional epoxy resin based on the total weight of the thin film photoresist epoxy resin composition.

An exemplary thin film photoresist layer made with the components described above after drying and curing is given in Table 1 below.

TABLE 1

| Component | Percent Weight |
| --- | --- |
| High Molecular Weight Phenoxy Resin | 40.0% |
| Di-functional Epoxy Resin | 30.0% |
| Multi-Functional Epoxy Resin | 30.0% |

A thin film photoresist resin mixture as described above may be suitable for providing the thin film photoresist layer 70 when combined with other components to provide a complete thin film photoresist formulation. An exemplary thin film photoresist formulation, containing an epoxy resin mixture as described above, is given in Table 2 below.

TABLE 2

| Component | Percent Weight |
| --- | --- |
| Thin Film Resin Mixture | 53.0% |
| Silane adhesion enhancer | 1.2% |
| Photoacid Generator | 11.8% |
| Solvent | 34.0% |

As shown in the foregoing table, the photoresist formulation for the thin film layer 70 may optionally include an effective amount of an adhesion enhancing agent such as a silane compound. Silane compounds that may be compatible with the components of the photoresist formulation typically may have a functional group capable of reacting with at least one member selected from the group consisting of the multi-functional epoxy compound, the high molecular weight phenoxy compound, and/or the di-functional epoxy compound, such as alkoxysilanes. For example, an adhesion enhancing agent may be an alkoxysilane with an epoxide functional group such as a glycidoxyalkyltrialkoxysilane, e.g., gamma-glycidoxypropyltrimethoxysilane.

When used, the adhesion enhancing agent may be present in an amount ranging from about 0.5 to about 5 weight percent, such as from about 1.0 to about 3.0 weight percent based on total weight of the cured thin film layer 70, including all ranges subsumed therein. In one exemplary embodiment, a suitable amount of the silane may be about 1.2 percent based on the total weight of the cured thin film layer 70. Adhesion enhancing agents, as used herein, are defined to mean organic materials soluble in the photoresist composition which assist the film forming and adhesion characteristics of the thin film layer 70.

A catalyst, such as a photoacid generator, may also be added to the thin film photoresist composition. A suitable photoacid generator may be a photoacid generator devoid of aryl sulfonium salts. An exemplary photoacid generator may be a compound or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides.

Of the aromatic complex salts which are suitable for use in exemplary photoresist formulation disclosed herein, suitable salts are di- and triaryl-substituted iodonium salts. Examples of aryl-substituted iodonium complex salt photoacid generates include, but are not limited to:
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)-phenyliodonium p-toluenesulfonate,
bis(4-tert-butylphenyl)iodonium hexafluorophosphate, and
diphenyliodonium hexafluoroantimonate.

Exemplary iodonium salts for use as a photoacid generator for the embodiments described herein are a mixture of diaryliodonium hexafluoroantimonate salts, commercially available from Sartomer Company, Inc. of Exton, Pa., under the trade name SARCAT CD 1012, and from Polyset Company of Mechanicville, N.Y., under the trade name PC-2506. A suitable amount of photoacid generator for the thin film photoresist composition may range from about 5 to about 20 percent by weight of the total thin film photoresist composition, and in one embodiment a suitable amount of catalyst may be about 11.8 percent by weight of the total thin film photoresist composition.

As set forth above, the thin film photoresist layer 70 may be applied as a dry thin film laminate adjacent to the thick film layer 36. Accordingly, the foregoing components of the thin film photoresist layer composition may be dissolved in a suitable solvent or mixture of solvents and dried on a release liner or other suitable support material. A solvent in which all of the components of the thin film photoresist layer are soluble is an aliphatic ketone solvent or mixture of solvents. A particularly useful aliphatic ketone solvent is methyl ethyl ketone (MEK). MEK may be used alone or, as in an exemplary embodiment, in combination with acetone. MEK may be used as the primary solvent for the thin film photoresist composition due to the solubility of the high molecular weight phenoxy resin in MEK. Acetone may optionally be used as a solvent to aid the film formation process. Since acetone is a highly volatile solvent it eludes off quickly after the film has been drawn down onto a release liner or support material. Volatilization of the solvent may help solidify the liquid resin into a dry film.

According to an exemplary embodiment, such a formulation may be capable of providing a photoresist layer 70 that may provide a nozzle member having a thickness ranging from about 1 microns to about 50 microns, for example, from about 5 to 30 microns, and in one embodiment ranging from about 10 microns to about 20 microns. Such a formulation may also be used to provide a photoresist layer 70 that may have a resolution of less than about 10 microns (e.g., about 6 microns), an aspect ratio (width to depth of the) of greater than about 2:1, such as about 5:1, and film properties (b-staged) of: 1) about 1% to about 50% elongation (e.g., about 1% to about 10%) and 2) a Elastic Modulus of about 2000 to about 8000 MPa (e.g., about 2000 to about 5000 MPa).

EXAMPLE

By way of comparison, a photoresist layer was made with a prior art formulation and a formulation according to the disclosed embodiments. The formulations are set forth in the following table.

TABLE 3

| Ingredients in Cured Phototresist Layer | Prior Art Formulation | Inventive formulation |
| --- | --- | --- |
| High Molecular Weight Phenoxy Resin | 40 wt. % | 40 wt. % |
| First Di-functional Epoxy Resin | 30 wt. % | 0 wt. % |
| Multi-Functional Epoxy Resin | 0 wt. % | 30 wt. % |
| Second Di-Functional Epoxy Resin | 30 wt. % | 30 wt. % |

Properties of photoresist layers, as determined by dynamic mechanical analysis, made with the products of the prior art formulation and the inventive formulation are set forth in the following table.

TABLE 4

| Properties of Photoresist layer | Prior Art Formulation | Inventive formulation |
| --- | --- | --- |
| Glass transition temperature Tan Delta peak (° C.) | 115 | 166 |
| Cross-link density (mmol/cc) at 10° C. + Tan Delta | 2.0 | 39.6 |
| Cross-link density (mmol/cc) at 30° C. + Tan Delta | 1.2 | 18.9 |
| Elastic modulus at 1176° C. (MPa) | 6.72 | 147.90 |
| Elastic modulus at 196° C. (MPa) | 4.19 | 73.75 |

As indicated by foregoing table, a layer made with the photoresist formulation according to the disclosed embodiments may have superior physical properties compared to the prior art photoresist layer. Also, the inventive formulation may be more sensitive to i-line radiation in a wavelength range of about 345 to about 385 nanometers, whereas as the prior art layer is less sensitive to the narrow wavelength and more reactive to the lower wavelengths less then 365 nm. The layer made with the photoresist formulation according to the disclosed embodiments is more transparent at wavelengths of about 365 nanometers and thus provides more uniform exposure during the radiation step of the process. Critical dimensions of the layer made according to the disclosure are easier to maintain using i-line radiation.

Figure 6:
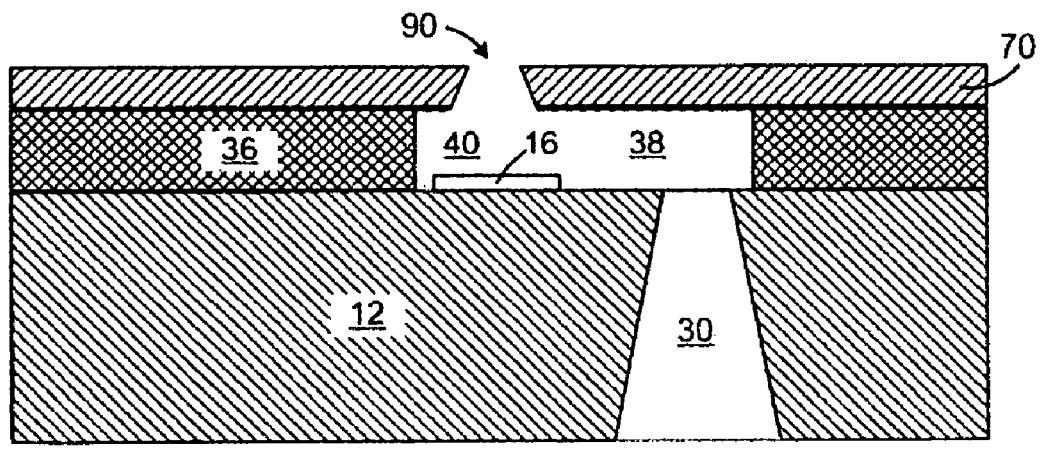
FIG. 6 cross-sectional view, not to scale, of a portion of a micro-fluid ejection head according to one embodiment of the disclosure containing a thin film photoresist nozzle plate laminated to a thick film layer.

With reference to FIGS. 5 and 6, a method for making a micro-fluid ejection head containing the thin film photoresist layer 70 will now be described. According to the method, the thin film photoresist layer 70 is laminated adjacent to the imaged and developed thick film layer 36 (FIG. 5). The thin film photoresist layer 70 may be laminated to the thick film layer 36 using heat and pressure. Next a mask 80 is used to define the nozzles 90 in the thin film photoresist layer 70. The mask 80 includes transparent areas 100 and opaque areas 102 defining the nozzles 90 in the photoresist layer 70. The opaque areas 102 prevent actinic radiation indicated by arrows 104 from contacting the thin film photoresist layer 70 in an area which will provide the nozzles 90, while the remainder of the thin film photoresist layer 70 is cured by the actinic radiation. Upon developing the thin film photoresist layer 70 with a suitable solvent, the nozzles 90 are formed in the thin film photoresist layer as shown in FIG. 6. Conventional photoimaging and developing techniques may be used to image and develop the thin film photoresist layer 70.

After developing the thin film photoresist layer 70, the substrate 12 containing the layer 36 and the layer 70 is optionally baked at temperature ranging from about 150° C. to about 200° C., such as from about from about 170° C. to about 190° C. for about 1 minute to about 60 minutes, such as from about 15 to about 30 minutes.

Accordingly, micro-fluid ejection heads made with the photoresist layer 70 as described herein may have better alignment of flow features, and thus greater functionality than micro-fluid ejection heads made with prior art photoresist formulations. Also, the photoresist formulation described herein may enable the production of thinner, more flexible nozzle plate materials that may be laminated to imaged and developed thick film layers on ejection head substrates.

Having described various aspects and exemplary embodiments and several advantages thereof, it will be recognized by those of ordinary skills that the disclosed embodiments is susceptible to various modifications, substitutions and revisions within the spirit and scope of the appended claims.

What is claimed is:

1. A photoimageable thin nozzle plate for a micro-fluid ejection head, comprising a photoresist layer derived from a composition comprising from about 15 to about 20 percent by weight of a high molecular weight phenoxy resin, from about 12 to about 18 percent by weight of a di-functional epoxy resin, from about 12 to about 18 percent by weight of a multi-functional epoxy resin, from about 0.5 to about 2 percent by weight of an adhesion enhancer, from about 10 to about 15 percent by weight of a photoacid generator devoid of aryl sulfonium salts, and an aliphatic ketone solvent, wherein the nozzle plate has a thickness ranging from about 5 to about 30 microns.

2. The photoimageable thin nozzle plate of claim 1, wherein the aliphatic ketone solvent is selected from the group consisting of methyl ethyl ketone, acetone, and combinations thereof.

3. The photoimageable thin nozzle plate of claim 1, wherein the adhesion enhancer comprises an alkoxysilane compound.

4. The photoimageable nozzle plate of claim 3, wherein the alkoxysilane compound comprises gamma-glycidoxypropyltrimethoxysilane.

5. A micro-fluid ejection device comprising the micro-fluid ejection head of claim 1.

6. A micro-fluid ejection head structure comprising a thick film photoresist layer adjacent to a device surface of a substrate and a thin photoresist nozzle plate adjacent to the thick film layer, the nozzle plate having a resin mixture including about 40 percent by weight of a high molecular weight phenoxy resin, about 30 percent by weight of a di-functional epoxy resin, and about 30 percent by weight of a multi-functional epoxy resin.

\* \* \* \* \*